United States Patent [19]

Marino et al.

[11] 4,194,188
[45] Mar. 18, 1980

[54] INTERROGATION OF KEY SWITCHES USING PULSE WIDTH DETECTION

[75] Inventors: Francis C. Marino, Dix Hills; Morton B. Herman, Queens Village, both of N.Y.

[73] Assignee: Redactron Corporation, Hauppauge, N.Y.

[21] Appl. No.: 836,526

[22] Filed: Sep. 26, 1977

[51] Int. Cl.² .................. G08C 25/00; G06F 3/02
[52] U.S. Cl. .......................... 340/365 E; 340/305 S
[58] Field of Search .......... 340/365 R, 365 C, 365 E, 340/365 S, 347 SH; 178/17 A, 17 C; 200/DIG. 1; 179/90 K

[56] References Cited

U.S. PATENT DOCUMENTS

| | | | |
|---|---|---|---|
| 3,825,926 | 7/1974 | Brownback | 340/365 E |
| 3,973,256 | 8/1976 | Stoesser et al. | 340/365 E |
| 4,020,391 | 4/1977 | Baxter | 340/365 S |
| 4,106,011 | 8/1978 | Melanson et al. | 340/365 E |
| 4,110,748 | 8/1978 | Marino | 340/365 R |

OTHER PUBLICATIONS

*Electronics*, May 15, 1975, pp. 83–85.

Primary Examiner—John W. Caldwell, Sr.
Assistant Examiner—James J. Groody
Attorney, Agent, or Firm—Hane, Roberts, Spiecens & Cohen

[57] ABSTRACT

In a keyboard having two depressable key switches which receive pulses of a first given width and transmit in response thereto pulses whose width is a function of the mechanical travel of the key switch, the travel of the key switches is detected by feeding a pulse of a first given width alternately to the key switches, sensing for the width of pulses transmitted by the key switches in response to receipt of the pulses of first given width. When the width of a pulse transmitted by one of the key switches in response to the receipt of one of the pulses of the first given width exceeds a second given width which is less than the first given width, there is fed a series of the pulses of first given width only to such one key switch and none of the pulses to the other of the key switches. Then, there is indicated that such one key switch has been reliably depressed if for a given period of time all the pulses transmitted by such one key switch in response to the series of pulses have at least the second given width.

15 Claims, 9 Drawing Figures

KEY BOARD SYSTEM KBS

KEY BOARD SYSTEM   KBS

SCANNED KEYBOARD SKB

KEY STATE TESTER KST

INTERROGATION OF KEY SWITCHES USING PULSE WIDTH DETECTION

BACKGROUND OF THE INVENTION

The invention pertains to keyboards and more particularly to the keyboards using key switches to control electrical signals.

Key switches can be used for many control and selection functions on devices such as word processors, text editors, typewriters, telephone handsets and calculators. The keyboards of such devices, since they control electronic signals, try to avoid the use of mechanical make and break contact switches because of their complexity, unreliability and cost. Thus, these keyboards utilize a variety of transducers to perform the switching operation. People have tried to use mechanically operated reed switches, Hall effect devices, photoelectronic devices and capacitive techniques. However, all of these electronic keyboard switches have less mechanical hysteresis than conventional "over-center" key switches.

Mechanical hysteresis is the phenomenom which occurs when a keyboard is depressed and an electrical signal is generated at a first point (make point) during the downward travel of the key. This signal cannot be generated again until the key is released and travels a certain distance to a second point (break point) above a first point and then travels downward again past the first point. The distance between the first and second points is the mechanical hysteresis. However, it is usually expressed as percentage of total key travel. For example, if the spacing between the first and second points is 0.010 inch and the total possible key travel is 0.20 inch then the key is said to have 5% mechanical hysteresis.

Usually, the make and break points are determined by the make and break levels of a sensing amplifier. Generally, a sensing amplifier in the form of a bistate device is utilized. The bistate device has electronic hysteresis so that the device assumes a first state upon receipt of a signal having a first level (the make level) and assumes a second state when the received signal is at a different (lower) level. The voltage difference between the two levels is the electronic or electrical amplitude hysteresis of the device. These first and second levels determine the level of the signals required from the key switch. If the level of the signal transferred from the key switch is a monotonic function of key switch displacement, then the first and second levels of the sensing amplifier fix the make and break points of the key switch.

It should be apparent that for a sensing device having a given electrical or electronic hysteresis one would want a key-switch transducer which has a great mechanical travel or hysteresis between the generation of the two different signal levels recognized. The reason is that the larger the mechanical hysteresis the smaller is the probability of emitting more than one signal from a single operation of the key switch transducer.

Of the many key switch devices, it has been found that capacitive switch devices (wherein the key acts as a coupling element between two coplanar pads) characteristically have the smallest mechanical hysteresis properties. In spite of this poor mechanical hysteresis property of conventional capacitive switch devices, they afford the greatest economy of manufacture since they rely on the positions of conductive elements that are easily printed on substrates. Therefore, it is highly desirable to utilize capacitive switch devices in multi-switch arrays such as keyboards.

In the copending application Ser. No. 674,215, now U.S. Pat. No. 4,110,748, filed Apr. 6, 1976, there is disclosed a method and apparatus for capacitive switch devices which do have increased mechanical hysteresis and immunity from key bounce. That invention has created a demand for even better capacitive key switch arrays.

SUMMARY OF THE INVENTION

It is an object of the invention to provide improved apparatus and methods for indicating the operation of capacitive key switches.

It is another object of the invention to increase the hysteresis of capacitive key switches.

Briefly, the invention contemplates the detection of the travel of key switches in a keyboard having at least two depressable key switches which receive pulses of a first given width or duration and transmit in response thereto pulses whose width or duration is a function of the mechanical travel of the key switch. Pulses of the first given width are alternately fed to the key switches. When the width of a pulse transmitted by one of the key switches in response to the receipt of a pulse of the first given width exceeds a second given width which is less than the first given width, a series of pulses of the first given width are then only fed to such one of the key switches and none to the other. If the width of all the pulses transmitted by such one of the key switches in response to the series of pulses are greater than the second given width for a certain period of time an indication is given that the key switch is reliably depressed.

BRIEF DESCRIPTION OF THE DRAWING

Other objects the features and advantages of the invention will be apparent from the following detailed description when read with the accompanying drawing which shows the presently preferred embodiment of the invention. In the drawing.

DESCRIPTION OF THE PREFERRED EMBODIMENT

The invention will be described in connection with a keyboard which employs prior art capacitive key switches. A knowledge of the operation of these key switches is essential to an understanding of the invention. Thus a typical key switch and its operation will now be described.

Figure 1A:
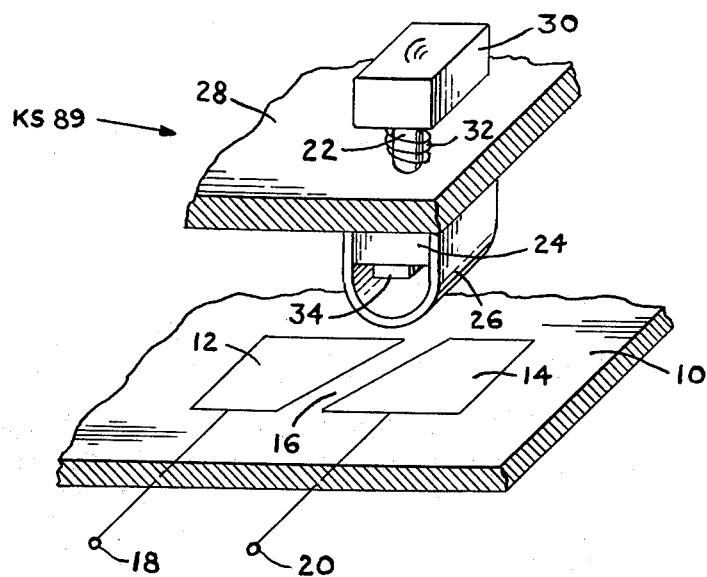
FIGS. 1a, 1b and 1c show a prior art capacitive key switch, the associated and equivalent circuitry for the key switch, and the waveforms for explaining the operation of the key switch.
Figure 1B:
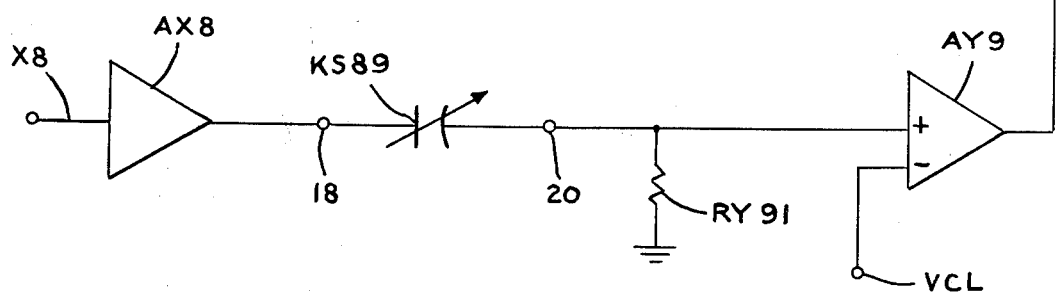

FIG. 1 shows a typical key switch KS89 and its associated circuitry which includes: a source of electrical pulses of a first width in the form of amplifier AX8 connected to line X8 which receives the pulses shown as waveform 36; an electrical signal differentiator means including key switch KS89 acting as a variable capacitor and resistor 9Y91; and a threshold amplifier AY9 which can be an open collector comparator of the type AM50032 made by Advanced Mirco Devices (AMD) 901 Thompson Place, Sunnyvale, Calif. having a (+)-input connected to the output of the differentiator means, a (−)-input connected threshold level voltage source VCL, and an output connected to line KY9.

The key switch KS89 is shown in FIG. 1a having an electrical circuit including a substrate 10 of insulative material. The pads 12 and 14 of conductive material are printed on the substrate and spaced from each other by a gap 16. The pad 12 is connected via a signal terminal 18 to amplifier AX8 and the pad 14 is connected via a signal terminal 20 to threshold amplifier AY9.

Normally pulses are fed to terminal 18 from amplifier AX8 and are sensed for at terminal 20 by amplifier AY9. The passage of the pulses from terminal 18 and pad 12 to pad 14 and terminal 20 is controlled by a capacitive coupling member.

The capacitive coupling member includes a switch stem 22 having a transverse portion 24 at an end opposite the pads 12 and 14. Fixed to the ends of portion 24 is a ribbon 26. The ribbon has a substrate 26 or backing of resilient plastic material such as MYLAR on which has been deposited a layer of metallic material such as aluminum or silver. The metallic material is then covered with a coating of insulating material. The member can be positioned opposite the pads by means of support 28 through which passes switch or key stem 22. The top end of the stem is provided with a key cap 30. Normally the key stem is biased in the retracted position as shown. One can use a spring such as a compression spring 32 or interacting magnets for such biasing.

In addition, there can be provided a bumper 34 of elastic material which acts as a stop for downward travel of the switch stem 22.

The operation of the key switch will now be described with the aid of the waveforms of FIG. 1c. Periodically, pulses as shown in waveform 36 are emitted from amplifier AX8 to terminal 18. The key switch KS89 acting as a variable capacitor and the resistor RY91 act as a conventional RC-differentiator wherein the leading edge of the pulse is assumed to be transmitted undisturbed while the remainder of the pulse is shaped according to the relationships:

$$e = \frac{RCE}{\tau} - \frac{RCE}{\tau} \cdot \exp(-t/RC); 0 < t < \tau$$

$$e = \frac{RCE}{\tau} [\exp(\tau/RC) - 1] \exp(-t/RC); t > \tau$$

Where $\tau$ is approximate rise time of input waveform; E is steady peak voltage of input waveform; t is time; R is the resistance of resistor RY91; and C is the capacitance of the variable capacitor KS89. For $RC >> \tau$, both equations reduce to the classical approximation $$e \approx E \exp(-t/RC).$$

Figure 1C:
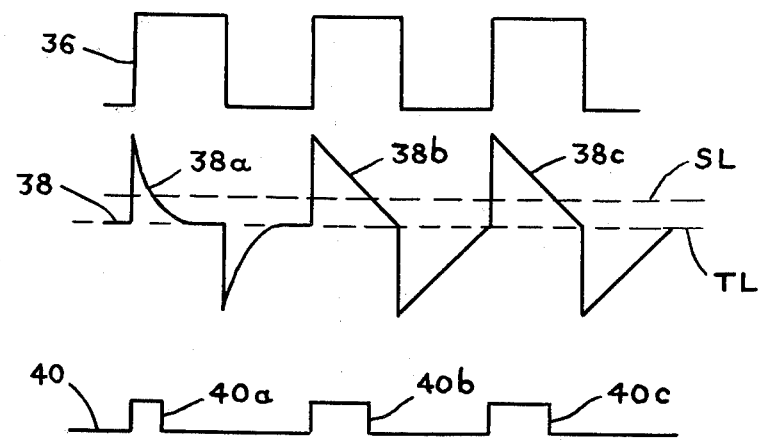

If the capacitance is low when key stem 22 is in a slightly depressed position then the waveform 38a of FIG. 1c is fed to amplifier AY9. The amplifier only passes signals above the threshold level TL and clips all signals above its saturation level SL. Thus, the output of amplifier AY9 is as shown in waveform 40a. On the other hand when the variable capacitor is set to a greater value, i.e., when key stem is in a more depressed position than waveform 38b or 38c is fed to the (+)-input of amplifier AY9 whose output is waveform 40b or 40c. Note the pulses emitted by amplifier AY9 have a width dependent on the instantaneous capacitance of the key switch KS89. The instantaneous capacitance and therefore the width of the pulses varies with the travel of key stem 22. The width of the pulses varies between limits which are greater than shown in waveform 40. In fact waveform 40b is considered to be the make point of the key switch and waveform 40a is considered to be the break point of the key switch. The travel distance of the key stem associated with the difference in the widths of the pulses of waveforms 40a and 40b is the hysteresis of the switch. The make point is preferably chosen in the region between one half and three quarters of the width of the pulses of waveform 36 and the break point in the region between one quarter and one half the width of the pulses of waveform 36.

Before describing the apparatus for realizing the invention, the method concept of the invention will be discussed. Although, the invention is preferably used with keyboards of upwards of one hundred key switches, the basic concept of the method of the invention is best described with respect to two key switches of the type discussed with respect to FIG. 1.

Initially single pulses of a first given width or duration such as, for example, 2.8 microseconds are alternately fed to first and second key switches, i.e., the first key switch receives a pulse at its input terminal, then the second key switch receives a pulse at its input terminal, and the process is repeated. All the time the output terminals of the key switches are sensed for pulses of a second given width. The second width can be greater than one half the first given width and preferably between one half and three-quarters thereof. As long as neither key switch is depressed either no pulse or a pulse of a very narrow width which is less than the second given width is transmitted from the output terminals of the key switches. The first time there is sensed at one of the key switches' output terminal a pulse equal to or greater than the second given width, the alternate scanning of the key switches stops. (It will be assumed that the output terminal of the first key switch emitted such a pulse.) A pulse of that width is emitted only when the key switch is depressed to or beyond the make point. However, since there can be key switch bounce or electrical transients, a debouncing step is activated. In general, a test is performed to insure that the first key switch remains depressed at or below its make or low point for a certain period of time. In particular, a series of pulses having the first given width are fed to the input terminal of the first key switch and none to the input terminal of the second key switch for say, one millisecond. If, at any time during that certain period of time, there is received at the output terminal of the first key switch, in response to a pulse of the first given width at the input terminal, a pulse having a width less than the second given width, the series of pulses is terminated and the alternate scanning is resumed and the whole operation is restarted. On the other hand, if all the pulses at the output terminal are equal to or greater than the second given width, then at the end of the series an indication is given that the first key switch has been reliably depressed. This indication not only causes the transfer of the character code for the key switch to a utilization device such as a printer or cathode ray tube display but the indication is stored so as to remember that the first key switch is in the depressed state. In addition, the alternate scanning of the two key switches is resumed by feeding single pulses of the first given width to their input terminals. Now, either one of two things can happen. Either the second key switch is depressed to its make point, in which case the operation continues for the second key switch as described for the first key switch; or, which is more likely, the first key switch is released to at least its break or high point as indicated by the sensing at its output terminal of a pulse of a third given width which can be less than half the first given width and is preferably between one half and one quarter thereof. Again, a debouncing step is activated. In general, a test is performed to insure that the first key switch remains released at or above its break or high point for a certain period of time. Again, a series of pulses having the first given width are fed to the input terminal of the first key switch and none to the input terminal of the second key switch for one millisecond. If, at any time during that certain period of time, there is received at the output terminal of the first key switch, in response to a pulse of the first given width at the input terminal, a pulse having a width greater than the third given width, the series of pulses is terminated and the alternate scanning is resumed. If all the pulses are equal or less than the third given width, then at the end of the series an indication is given that the first key switch is reliably released and the previously stored indication about depression of the first key switch is replaced by an indication that the key has been released.

Figure 2:
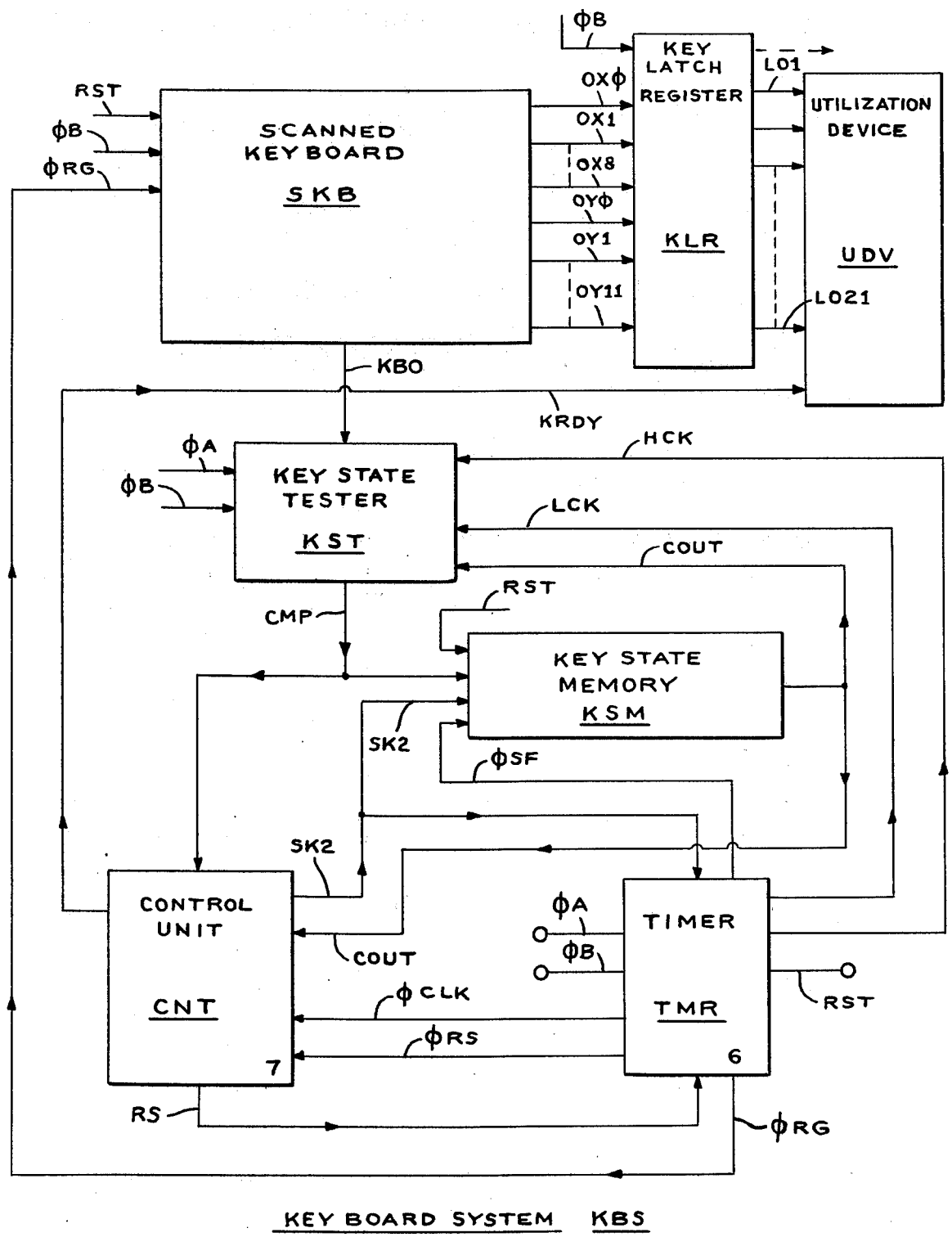
FIG. 2 is a block diagram of a keyboard system for realizing the invention.

Many combinations of apparatus can be assembled to perform the above described operations. However, FIG. 2 shows a presently preferred embodiment of a keyboard system KBS consisting of a scanned keyboard SKB, a key latch register KLR a utilization device UDV, a key state tester KST, a key state memory KSM, a control unit CNT, and a timer TMR.

The scanned keyboard SKB hereinafter described includes a keyboard having, for example, a nine row by twelve column matrix of key switches as described with respect to FIG. 1. The key switches are sequentially scanned, repetitively in a particular order, i.e., a single interrogation pulse (a pulse of the first given width) is fed to the input of each key switch sequentially, as long as stepping pulses are received via line $\phi$RG from timer TMR. Whenever the stepping pulses on line $\phi$RG are interrupted the last key switch that was interrogated continues to receive interrogation pulses until the stepping pulses are resumed. In response to each stepping pulse a coded combination of twenty one signals are fed onto lines OX$\phi$ to OX8 and OY$\phi$ to OY11 representing the key switch being scanned and therefore the character associated with the depressed key switch.

In addition, in response to each stepping pulse there is emitted a pulse of variable width on line KBO, the width being dependent on the state of the key switch then being interrogated. The key latch register KLR consists of twenty one D-latches each having an input connected to one of the lines OX$\phi$ to OY11 for temporarily storing the coded combination of signals representing the character related to the key switch then being interrogated.

The utilization device UDV can be twenty one two-input AND-circuits each having a first input connected to one of the lines LO1 to LO21, respectively connected to outputs of the latches of register KLR and the second input connected to the line KRDY. In addition, the device UDV can include a printer, cathode ray tube or the like which is energized upon receipt of a coded combination of signals on lines LO1 and LO21 coincident with a pulse on line KRDY.

The key state tester KST basically tests whether the width of the pulse on line KBO is greater than the second given width by utilizing the signal on line HCK or less than the third given width by utilizing the signal on line LCK. In addition by utilizing the signal on line COUT, the tester will emit a signal on line CMP in accordance with the width of the pulse on line KBO and the previous state of the associated key switch.

The key state memory KSM can be a 108-bit recirculating shift register with each position storing the state of depression or release of a particular key switch. Such states are sequentially indicated by the level of the signal on line COUT. The scanned keyboard SKB and the key state memory KSM operate in synchronism, i.e., when the keyboard is interrogating a particular key switch, an indication of the previously-stored state of that key switch is present on line COUT.

The control unit CNT basically sequences the system through its operations while the timer TMR provides the initializing, clocks, and stepping pulses for the system.

The operation of the system in performing the above-described method will now be discussed. Initially the timer TMR emits a signal on line RST which initializes, all flip-flops, latches, counters, and registers. Then timer TMR starts emitting pulses on line $\phi$RG, and the scanned keyboard SKB starts sequentially interrogating the key switches. As each key switch is interrogated a pulse may be emitted onto line KBO, the presence of the pulse and its width is determined, as described above, on whether the key stem of the key switch is depressed and how much. Nevertheless, at the same time, a coded combination of signals on lines OX$\phi$ to OY11 are fed via key to latches register KLR and lines LO1 to LO21 to the input of utilization device UDV. This coded combination of signals which represents the character associated with the key switch being interrogated will only be accepted by utilization device UDV when a signal is present on line KRDY.

Now there are several possibilities. It can be that the key switch being interrogated (for the sake of definiteness called the first key switch) has not been depressed without being released. This would be indicated by the absence of a signal on line COUT at this time. It can also be that this first key switch has been depressed and not yet released. This would be indicated by the presence of a signal on line COUT at this time.

Consider now the first possibility. If the pulse on line KBO is greater than the required two-third width indicating that the make point of the key switch has been reached, key state tester KST in response to the presence of a signal on line HCK (used for testing for the make-point pulse-width) and the absence of a signal on line COUT (indicating the key switch was not in the depressed state at the previous interrogation) emits a signal on line CMP. If there is no pulse or if the width of the pulse on line KBO is less than the two-third width no signal is emitted on line CMP and the scanned keyboard SKB proceeds to interrogate the next key switch in order. However, the coincidence of the presence of a signal on line CMP and the absence of a signal on line COUT in control unit CNT indicate that a key switch in the previously released state has been depressed and a "make debouncing" test is initiated. Assume that the initial depression of the first key switch caused this action. Control unit CNT emits a signal on line RS which when received by timer TMR interrupts the generation of the pulses on line $\phi$RG causing the keyboard KSB to continuously interrogate the first key switch. THe timer TMR also interrupts the generation of the shift pulses on line $\phi$SF for the key state memory KSM such that the stored state of the first key switch is continuously present on line COUT. The interrogation of the first key switch will now occur for one millisecond unless previously terminated. Now, for each interrogation pulse there will be emitted on line KBO a pulse in the usual manner. As long as the pulses on line KBO are greater than the two-third width key state tester KST will emit a signal on line CMP as described above. However, if because of key bounce or false indicating because of a transient, a pulse on line KBO is less than the two-third width, tester KST will not emit a signal on line CMP. The absence of this signal in control unit CNT terminates the signal on line RS causing timer TMR to again emit the pulses on lines $\phi$RG and $\phi$SF and the usually scanning of the key switches is resumed. If on the other hand all the pulses emitted on line KBO do exceed the two-third width for the required time, then control unit CNT indicates that the key switch has been reliably depressed by emitting a signal on the KRDY line to utilization device UDV which then accepts the coded combination of signals on lines LO1 to LO21 representing the character associated with the first key switch. At the same time control unit CNT emits a pulse on line SK2 which cooperates with the signal on line CMP in key state memory KSM to load a logic '1' (the value of CMP at this time) into the position of the first key switch so that hereafter when this first key switch is again interrogated there will be a signal on line COUT indicating that said key switch has been depressed and not released. Finally, the signal on line RS is terminated to reinitiate the generation of the pulse signals on lines $\phi$RG and $\phi$SF and scanning resumes. If a second key switch is depressed the same routine is repeated for that key switch.

Now consider the second possibility with respect to the first key switch, i.e., it is depressed and not yet released. When during the interrogation of this first key switch as described above, the width of the pulse emitted on line KBO falls below the one-third width, the key state tester KST in response to a signal on line LCK, which tests for less-than one-third width does not emit a signal on line CMP. The presence of a signal on line COUT at this time indicating that the first key switch was previously depressed and the absence of a signal on line CMP cause control unit CNT to emit the signal RS indicating a "break debouncing" test.

This test is exactly the same as the above described "make debouncing" test with the following exception. During the continuous interrogation of the first key switch the width of the pulses on line KBO are tested to be at or below the one-third width. As long as the widths stay below this value there is no signal on line CMP. If one of the pulses exceeds this one-third width value there is a signal on line CMP causing the control unit CNT to terminate the signal on line RS causing the resumption of the pulses on lines $\phi$RG and $\phi$SF and the scanning of the key switches. On the other hand, if the pulses stay below the one third width for a given period of time, then the control unit CNT in addition to terminating the signal on line RS sends a signal out on line SK2 which cooperates with the signal on line CMP to load a logic '0' (the value of CMP at this time) so that the bit previously stored in the position for the first key switch is deleted to, in effect, store the fact that this key switch has been released. Then the scanning is again resumed.

The various elements of the system of FIG. 2 will now be described in detail.

Figure 3:
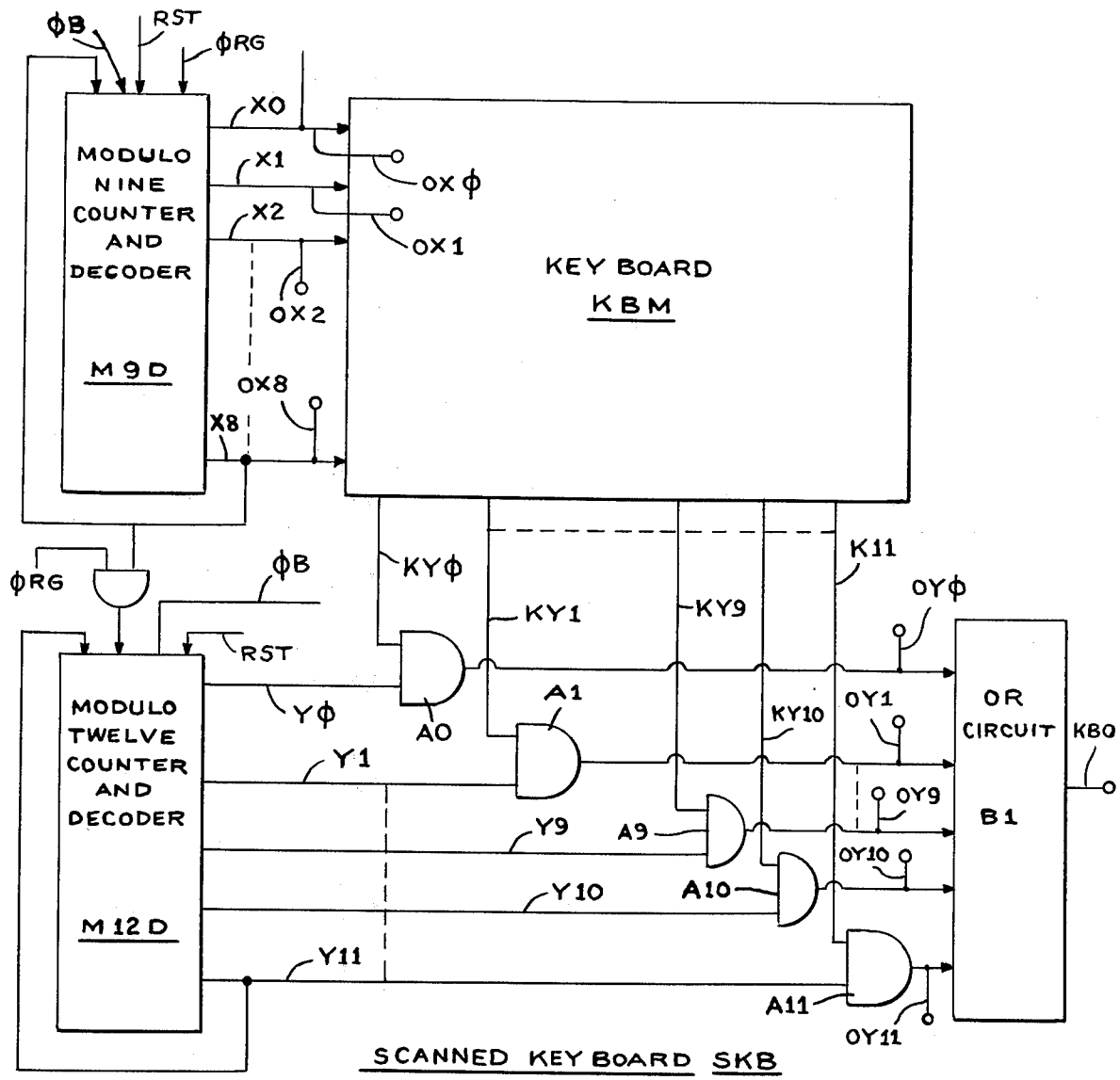
FIG. 3 is a block diagram of the scanned keyboard of the system of FIG. 2.

The scanned keyboard SKB is shown in FIG. 3 centered around keyboard KBM. The keyboard KBM is, by way of example, a nine row by twelve column matrix of the key switches shown in FIG. 1. Within each row, the input terminals of the twelve key switches are all connected to a common line. For example, the input terminals of the key switches of the ninth row including key switch KS89 of FIG. 1 are connected to line X8. Within each column the output terminals of the nine key switches are all connected to a common line. For example, the output terminals of the key switches of the tenth column including key switch KS89 are all connected to line KY9.

The rows are scanned utilizing modulo nine counter and decoder until M9D. The unit can consist of a conventional chain of binary counter stages which are interconnected to count modulo nine the pulses received on line $\phi$RG. The outputs of the counters are fed to a conventional "binary-to-decimal" decoder which is sampled by pulse signals on line $\phi$B. The outputs of the decoder are connected to lines X$\phi$ to X9. The columns are scanned by connecting each column line to one input of a two-input AND-circuit whose other input is connected to one of the outputs of modulo twelve counter and decoder unit M12D. Unit M12D is similar to unit M9D except that it counts modulo 12 basically the pulses on line X8. Thus, for example, line KY9 is connected to one input of AND-circuit A9 whose other input is connected to line Y9. The outputs of all the AND-circuits A0 to A11 are connected to inputs of twelve-input OR-circuits B1 whose output is connected to line KBO.

Figure 4:
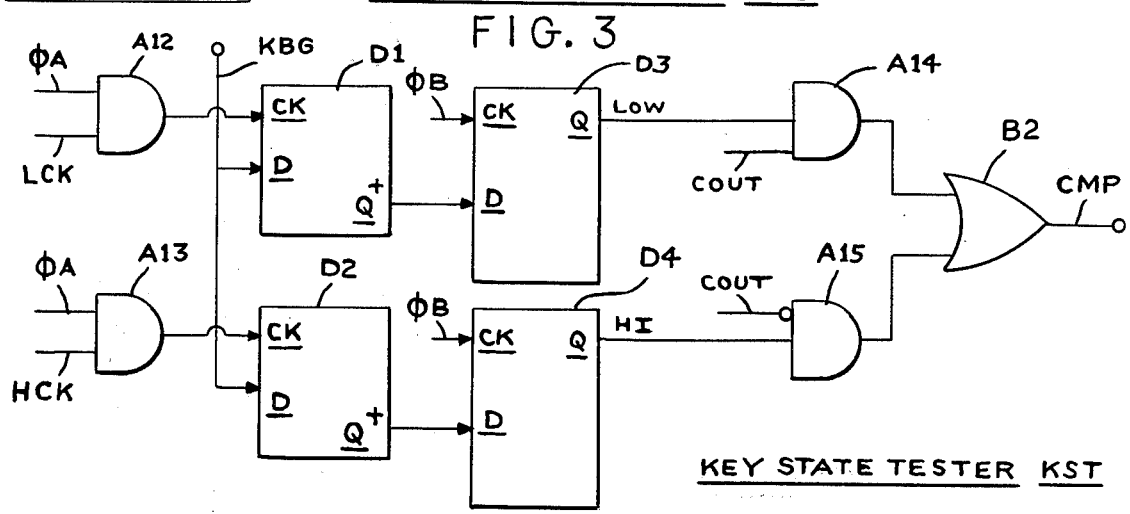
FIG. 4 is a logic diagram of the key state tester of the system of FIG. 1.

The key state tester KST shown in FIG. 4 comprises two comparison channels, one associated with key switch make the other with key switch break. The make channel includes: two-input AND-circuit A12 which receives the signal on line LCK associated with the break pulse width and a strobe or sampling pulse on line $\phi$A; the cascaded D-latches D1 and D3 with the D-input of latch D1 receiving the width modulated pulses on line KBO from the scanned keyboard SKB; and the two-input AND-circuit A14 with a first input connected to the output of latch D3 and a second input connected to line COUT. The make channel includes: AND-circuit A13 having a first input connected to line HCK and a second input which receives sampling pulses on line $\phi$A; the cascaded D-latches D2 and D4 with the D-input of latch D2 receiving the width modulated pulses on line KBO; and the two-input AND-circuit A15 having the first input connected to the output of D-latch D4 and the second (an inverting) input connected to line COUT. The outputs of AND-circuits A14 and A15 are connected to inputs of OR-circuit B2 whose output is connected to line CMP.

Figure 5:
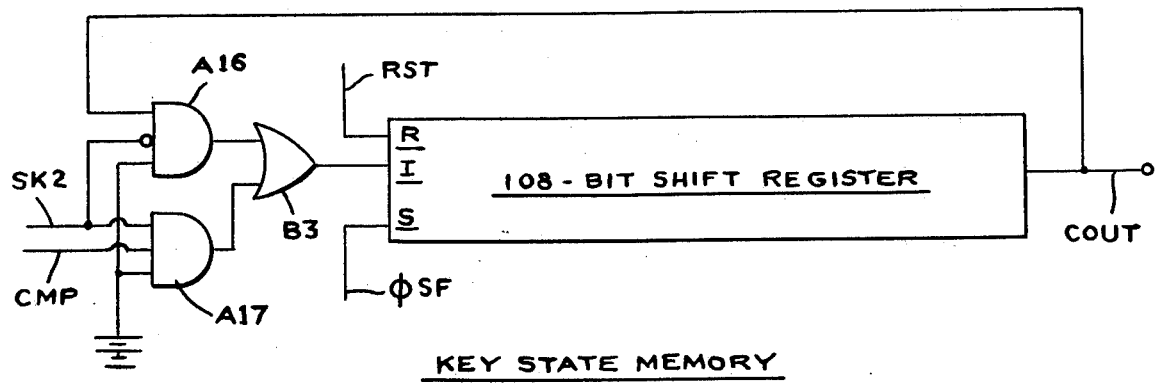
FIG. 5 is a block and logic diagram of the key state memory of the system of FIG. 1.

The key state memory KSM shows in FIG. 5 centers around a 108-bit recirculating shift register wherein each bit position stores the present state of one of the key switches. The shift register has an initial clear input R connected to the line RST, a shift pulse input S connected to line φSF and a data input I connected to the output of OR-circuit B3. The first input of OR-circuit B3 is connected to the recirculating gate AND-circuit A16, and the second input is connected to the "insert a one bit" gate, AND-circuit A17. The first input of AND-circuit A16 is connected to line COUT which is the output of the register and carries the state of the presently interrogated key switch. The second (an inverting) input is connected to line SK2 from the control unit for allowing the bits to recirculate. The first input of AND-circuit A17 is connected to line CMP, the second input to line SK2 and the third input to the high signal level so that, when required, a logic 0 or logic 1 is recorded in the register according to the value of CMP at the time SK2 is valid, i.e., in effect there is a change from a zero bit to a one bit in the available position.

Figure 6:
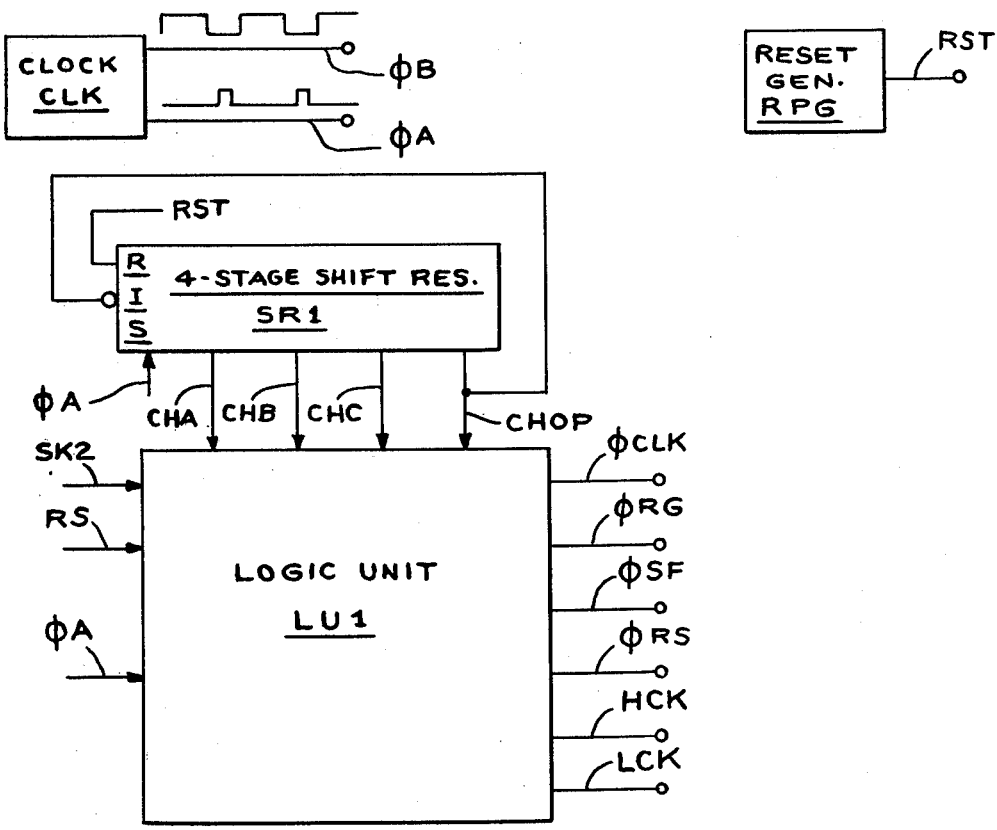
FIG. 6 is a block and logic diagram of the timer of the system of FIG. 1.

The timer TMR shown in FIG. 6 includes: a clock CLK which generates periodic clock and sampling pulses on lines φA and φB; a reset pulse generator RPG which generates a controlled initializing or reset pulse of line RST to start the system; and a miscellaneous pulse generator centered around four-stage shift register SR1 whose four stage outputs are connected via lines CHA, CHB, CHC, and CHOP to inputs of logic unit LU1. The shift register SR1 in response to an initial clear signal on line RST connected to the reset input R is loaded with all one bits. The output of the fourth stage is connected via line CHOP to the data (an inverting) input I of the register. The contents of the register is shifted by pulses on line φA fed to the shift input S.

The logic unit LU1 is an array of AND-circuits, OR-circuits and inverters which satisfy the following Boolean equations.

Figure 7:
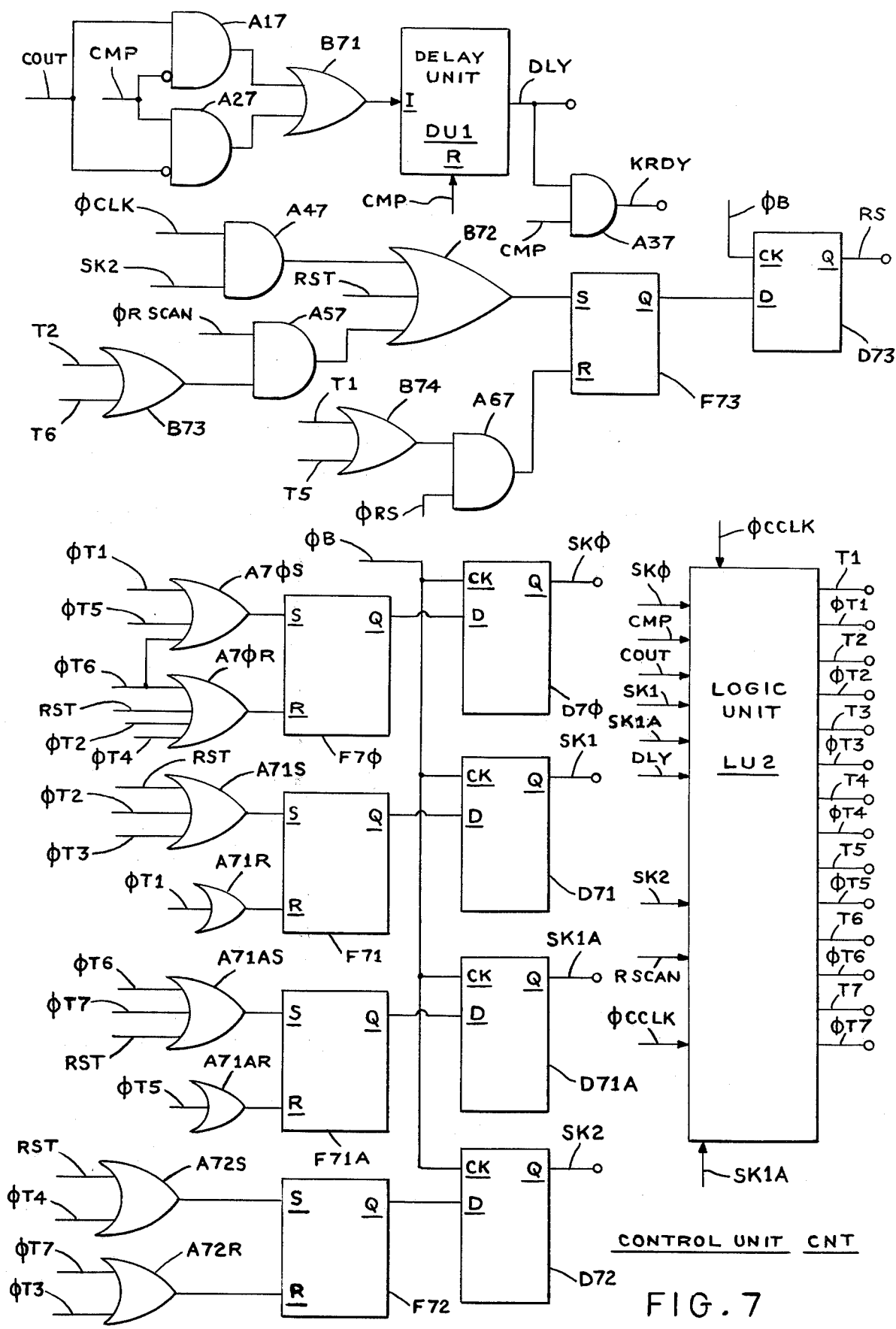
FIG. 7 is a block and logic diagram of the control unit of the system of FIG. 1.

$CHC \cdot \overline{CHB} \cdot \overline{SK2} = HCK$ $\overline{CHA} \cdot CHB \cdot \overline{SK2} = LCK$ $CHC \cdot \overline{CHOP} \cdot \phi A = \phi CLK$ $CHC \cdot \overline{CHOP} \cdot \phi A \cdot RS = \phi RG$ $\phi CLK \cdot RS = \phi SF$ $CHA \cdot \overline{CHB} \cdot \phi A = \phi RS$ The control unit CNT shown in FIG. 7 centers around a state counter having four stages whose outputs are connected to lines SKφ, SK1, SK1A and SK2. Each of the stages includes a set-reset flip-flop whose output drives a D-latch. For example, the nth stage associated with the line SKN includes the D-latch D7N having a clock input CK connected to line φB and a data input D connected to the Q-output of set-reset flip-flop F7N whose set input S is conncted to set AND-circuit A7NS and whose reset input R is connected to reset AND-circuit A7NR.

The first of the four states is state "zero" indicated by a signal on line SKφ. In this state the key switches are sequentially scanned with single interrogating pulses. There are two possible second states called states "one" and "one a". In state "one" manifested by a signal on line SK1, the debouncing of a key-switch make is performed. In state "one a" manifested by a signal on line SK1A, the debouncing of a key-switch break is performed. State "two" occurs if there has been a successful debouncing routine and is manifested by signals a signal on line SK2.

The states are set up by the setting and resetting of the flip-flops F7N in response to signals generally on lines φTN generated by logic unit LU2.

The logic unit LU2 is composed of a plurality of AND-circuits, OR-circuits and inverters which satisfy the following Boolean equations:

$SK\phi \cdot CMP \cdot \overline{COUT} = T1$ $T1 \cdot \phi CLK = \phi T1$ $SK1 \cdot \overline{CMP} = T2$ $T2 \cdot \phi CLK = \phi T2$ $DLY \cdot CMP \cdot SK1 = T3$ $T3 \cdot \phi CLK = \phi T3$ $SK2 \cdot RS \cdot \phi CLK = \phi T4$ $COUT \cdot \overline{CMP} \cdot SK\phi = T5$ $T5 \cdot \phi CLK = \phi T5$ $SK1A \cdot CMP = T6$ $T6 \cdot \phi CLK = \phi T6$ $SK1A \cdot \overline{CMP} \cdot DLY = T7$ $T7 \cdot \phi CLK = \phi T7$ The debouncing timer centers around delay unit DU1, a conventional device, which when triggered at its input I connected to the output of OR-circuit B71 by a pulse emits a pulse on its output connected to line DLY one millisecond later unless the signal on line CMP at its reset input R goes low during that time. The inputs of OR-circuit B71 are respectively connected to the outputs of AND-circuits A17 and A27. One input of AND-circuit A17 is connected to line COUT and the other input (an inverting) input is connected to line CMP. One input of AND-circuit A27 is connected to line CMP and the other input (an inverting) input is connected to line COUT. The output of the unit DU1 is connected to one input of AND-circuit A37 whose other input is connected to line CMP and whose output is connected to line CMP.

The stalling means for locking the interrogation to a particular key switch centers around the RS signal generator which includes the set-reset flip-flop F73 driving the D-latch D73 whose output is connected to line RS. The set input S of the flip-flop is connected to the output of OR-circuit B72 and the reset input R to the output of AND-circuit A67.

While only one embodiment of the invention has been shown and described in detail there will now be obvious to those skilled in the art many modifications and variations that satisfy many or all of the objects of the invention as defined by the appended claims.

What is claimed is:

1. In a keyboard having at least two depressable key switches which receive pulses of a first given width and transmit in response thereto pulses whose width is a function of the mechanical travel of the key switch, the method of detecting the travel of the key switches comprising the steps of feeding a pulse of a first given width alternately to the key switches, sensing for the width of pulses transmitted by the key switches in response to receipt of said pulses of first given width, when the width of a pulse transmitted by one of the key switches in response to the receipt of one of the pulses of said first given width exceeds a second given width which is less than said first given width, feeding a series of said pulses of first given width only to said one key switch and none of said pulses to the other of the key switches, and indicating that said one key switch has been reliably depressed if for a given period of time all the pulses transmitted by said one key switch in response to said series of pulses have at least said second given width.

2. The method of claim 1 further comprising terminating the feeding of said series of pulses to only said one key switch and resuming the feeding of the pulses of said first given width alternately to the key switches if either the width of a pulse transmitted by said one key switch is less than said second given width or said given period of time ends.

3. The method of claim 1 further comprising storing the indication that said one key switch has been reliably depressed.

4. The method of claim 3 further comprising the steps of, after storing the indication that said one key switch has been reliably depressed, resuming the feeding of the pulses of said first given width alternately to the key switches, and again sensing for the width of pulses transmitted by the key switches in response to receipt of said pulses of first given width.

5. The method of claim 4 further comprising the steps of when the width of a pulse transmitted by the other of the key switches in response to the receipt of one of said pulses of first given width exceeds said second given width feeding another series of said pulses of first given width only to said other key switch and indicating that said other key switch has been reliably depressed if for a given period of time all the pulses transmitted by said other key switch in response to said other series of pulses have at least said second given width.

6. The method of claim 4 further comprising the steps of when the width of a pulse transmitted by said one key switch in response to the receipt of one of the pulses of said first given width is less than a third given width which is less than said second given width feeding another series of pulses of said first given width only to said one key switch in response to a stored indication that said one key switch has been reliably depressed and indicating that said one key switch has been reliably released if for a given period of time each of the pulses transmitted by said one key switch in response to said other series of pulses have a width less than said third given width.

7. The method of claim 6 further comprising terminating said other series of pulses fed to said one key switch and resuming the feeding of the pulses of said first given width alternately to the key switches if either the width of a pulse transmitted by said one key switch is greater than said third given width or said given period of time ends.

8. The method of claim 6 wherein said second given width is greater than one half of said first given width.

9. The method of claim 8 wherein said second given width is between one-half and three-quarters of said first given width.

10. The method of claim 6 wherein said third given width is less than one-half of said first given width.

11. The method of claim 10 wherein said third given width is between one-quarter and one-half of said first given width.

12. A keyboard system comprising: a plurality of key switch means, each of said key switch means having a movable key, an input adapted to receive sampling pulses of a first given width, an output for emitting pulses of different widths and pulse-width modulating means connected to said movable key and connecting said input to said output for transmitting a pulse to said output in response to a pulse received at said input, the emitted pulse having a width which is a function of the travel of said movable key; a pulse generator means emiting a single sampling pulse to the input of each of said key switch means sequentially; low sensing means connected to the output of each of said key switch means for giving a low-key indication whenever a pulse having a width greater than a second given width which is less than said first given width is emitted from the output of the key switch means whose input is then receiving a pulse of said first given width from said pulse generator means; stalling means responsive to said low-key indication for stalling said pulse generator means on the input of the key switch means whose output activated said low sensing means whereby pulses of said first given width are continuously fed to said input; delay means responsive to said low-key indication for deactivating said stalling means for a given time interval which is a multiple of said first given width, after the activation of said stalling means whereby said pulse generator resumes emitting a single pulse to the input of each of said key switch means sequentially; and indicating means responsive to said delay means for emitting a depressed-key indication that a key switch has reliably operated if a low key indication is received at the end of said given time interval.

13. The keyboard system of claim 12 further comprising interrupting means for deactivating said delay means and said stalling means before the end of said given interval of time and preventing the operation of said indicating means if a low key indication is not received in response to a pulse of said first given width being fed to the input of said key switch means whose output initially activated said low sensing means during said given interval of time.

14. The keyboard system of claim 13 further comprising a memory means having a plurality of memory cells, each of said memory cells being assigned to one of said key switch means and means responsive to indicating means for storing in the associated memory cell the indication emitted by said indicating means.

15. The keyboard system of claim 14 further comprising high sensing means connected to the output of each of said key switch means for giving a high-key indication whenever a pulse having a width greater than a third given width which is less than said second given width is emitted from the output of the key switch means whose input is then receiving a pulse of said first given width from said pulse generator; means responsive to said high sensing means and said memory means for activating said stalling means and said delay means when a high-key indication is received from a key switch means whose memory cell is storing a depressed-key indication; and further indicating means responsive to said delay means for emitting a released-key indication that said key switch means has been reliably released.

* * * * *